US006210483B1

(12) United States Patent
Tsai et al.

(10) Patent No.: US 6,210,483 B1
(45) Date of Patent: Apr. 3, 2001

(54) ANTI-NOTCH THINNING HEATER

(75) Inventors: Ken Tsai, Redwood City; Steve Ghanayem, Sunnyvale; Joseph Yudovsky, Palo Alto; Ken Lai, Santa Clara, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/203,419

(22) Filed: Dec. 2, 1998

Related U.S. Application Data

(60) Provisional application No. 60/067,129, filed on Dec. 2, 1997.

(51) Int. Cl.[7] .............................. C23C 16/00; H05H 1/00
(52) U.S. Cl. .............................. 118/723; 156/345
(58) Field of Search .............................. 118/728, 715, 118/724, 725; 156/345

(56) References Cited

U.S. PATENT DOCUMENTS 4,209,357 6/1980 ..... Gorin et al. .... 156/643
4,579,618 4/1986 Celestino et al. .... 156/345
4,585,920 4/1986 Hoog et al. .... 219/121 PR
4,892,753 1/1990 Wang et al. .... 427/38
4,997,677 3/1991 Wang et al. .... 427/248.1
5,198,034 3/1993 deBoer et al. .... 118/725
5,228,501 7/1993 Tepman et al. .... 165/80.1
5,230,741 7/1993 van de Ven et al. .... 118/728
5,231,690 7/1993 Soma et al. .... 392/416
5,238,499 8/1993 van de Ven et al. .... 118/724
5,252,131 10/1993 Kiyama et al. .... 118/719
5,292,554 3/1994 Sinha et al. .... 427/251
5,304,248 4/1994 Cheng et al. .... 118/728
5,324,553 6/1994 Ovshinsky et al. .... 427/571
5,326,725 7/1994 Shertinsky et al. .... 437/225
5,343,938 9/1994 Schmidt .... 165/80.2
5,352,294 10/1994 White et al. .... 118/725
5,370,739 12/1994 Foster et al. .... 118/725
5,374,315 12/1994 deBoer et al. .... 118/725
5,374,594 12/1994 van de Ven et al. .... 437/247
5,383,971 1/1995 Selbrede .... 118/728
5,421,893 6/1995 Perlov .... 118/725
5,437,757 8/1995 Rice et al. .... 156/345
5,443,648 8/1995 Ohkase .... 118/724
5,476,548 12/1995 Lei et al. .... 118/728
5,492,566 2/1996 Sumnitsch .... 118/500
5,505,779 4/1996 Mizuno et al. .... 118/719
5,516,367 5/1996 Lei et al. .... 118/725
5,525,160 6/1996 Tanaka et al. .... 118/728
5,534,072 7/1996 Mizuno et al. .... 118/728
5,556,476 * 9/1996 Lei et al. .... 118/728
5,578,532 11/1996 van de Ven et al. .... 437/245
5,582,866 12/1996 White .... 427/248.1
5,589,224 12/1996 Tepman et al. .... 427/248.1
5,695,568 12/1997 Sinha et al. .... 118/729
6,040,011 * 3/2000 Yudovsky et al. .... 118/728

FOREIGN PATENT DOCUMENTS 0 456 372 A1 11/1991 (EP) .
0 467 623 A2 1/1992 (EP) .
2171877 9/1973 (FR) .
63-6833 1/1988 (JP) .
5-226252 9/1993 (JP) .
WO 90/13687 11/1990 (WO) .
WO 94/01597 1/1994 (WO) .

* cited by examiner

*Primary Examiner*—Gregory Mills
*Assistant Examiner*—P. Hassanzadef
(74) *Attorney, Agent, or Firm*—Thomason, Moser & Patterson, LLP

(57) ABSTRACT

The invention provides an apparatus for excluding unwanted deposition at the edge of a substrate which prevents excess purge gas from flowing over the surface of the substrate at the region adjacent a notch on a substrate. Another aspect of the invention provides a wider purge gas channel that prevents excess purge gas from flowing over the surface of the substrate. Still another aspect of the present invention provides a purge gas guide that includes a notch therein to prevent excess purge gas from adversely affecting deposition at the vicinity of the substrate notch.

20 Claims, 5 Drawing Sheets

ANTI-NOTCH THINNING HEATER

This application claims priority from U.S. Provisional Patent Application Ser. No. 60/067,129, filed Dec. 2, 1997.

BACKGROUND OF THE INVENTION

1. Field of the Invention

The present invention generally relates to a chemical vapor deposition (CVD) chamber. More particularly, the present invention relates to an improved susceptor used in a CVD chamber.

2. Background of the Related Art

CVD vacuum chambers are useful for depositing thin films on semiconductor substrates. Generally, a precursor gas is flown into a vacuum chamber through a gas distribution system and reacts with a heated substrate surface to deposit a thin film thereon. The deposition gas reaction also forms volatile by-product gases which are pumped away through a chamber exhaust system. Typically, a susceptor or substrate support member is provided to secure the substrate during the deposition process as well as to heat the substrate to the required processing temperature. Furthermore, a purge gas is flown towards the backside and/or edge of the substrate during processing to prevent deposition on the backside and the edge of the substrate which tends to flake off and contaminate the chamber. Exemplary CVD chambers are disclosed in U.S. Pat. Nos. 5,516,367 and 5,476,548, both of which are hereby incorporated by reference.

To increase manufacturing efficiency and device capabilities, the sizes of the devices formed on a substrate have decreased while the number of devices formed on a substrate has increased. Uniform CVD deposition across the surface of the substrate has become increasingly important to form uniform devices on substrates and to maximize the number of devices that can be formed on the substrate. Moreover, reduction of particle contaminates generated in the chamber has also become increasingly important to produce functional devices.

FIG. 1*a* is a partial cross sectional view of a substrate 14 supported on a susceptor having a purge gas channel 30 surrounding the edge of the substrate. FIG. 1*b* is a partial top perspective view of the substrate 14 supported on the susceptor showing the purge gas channel 30 surrounding the edge of the substrate. As shown in FIG. 1*a*, the substrate 14 is releaseably secured on the susceptor surface by a vacuum chuck having vacuum channels 20 which are connected to a vacuum pump (not shown), and the edge of the substrate is surrounded by a purge gas channel 30. A purge gas feed line 22, preferably disposed within the susceptor 10, feeds a purge gas into the purge gas channel 30 surrounding the edge of the substrate 14, thereby inhibiting the process gas from coming in contact with the substrate edge and depositing thereon. Preferably, a plurality of purge gas feed lines 22 supply purge gas into the purge gas channel 30 to achieve even distribution of the purge gas to the edge of the substrate.

Generally, the purge gas flows past the edge of the substrate 14 and outwardly away from the center of the substrate. However, because a substrate typically includes a notch 16 at the substrate edge as an identifying mark of the type and the orientation of the substrate, an excess amount of purge gas passes through the notch, diluting the processing gases adjacent to the notch and preventing formation of functional devices in the region adjacent to the notch. FIG. 1*b* shows the effects of the purge gas, as indicated by the arrows, in the region adjacent to the notch. Typically, deposition in the region adjacent to the notch 16 is non-uniform because the excess purge gas coming through the notch creates an area of exclusion on the substrate. Thus, the region adjacent the notch 16 is wasted because of improper processing.

A similar purging effect in the region adjacent the notch occurs in a processing system where a purge guide is used for controlling the purge gas. FIG. 2*a* is a partial cross sectional view of a purge guide 26 in combination with a substrate 14 disposed on a susceptor 10 in a processing position. FIG. 2*b* is a partial top view of a purge guide and a substrate having a notch 16, showing the effects of the purge gas in the region adjacent the notch. As shown in FIG. 2*a*, the substrate 14 is supported by the susceptor 10 and releaseably secured on the susceptor surface by a vacuum chuck having vacuum channels 20 which are connected to a vacuum pump (not shown). When the susceptor 10 is moved to a processing position, the purge guide 26 rests on the susceptor 10, preferably on a plurality of anti-sticking grooves 21, and a shield portion 12 of the purge guide 26 extends over the edge of the substrate 14. The shield portion 12 of the purge guide 26 maintains a fixed gap, typically between about 2 and about 10 mils, above the substrate 14 through which the purge gas flows as the gas continues into the processing area of the CVD chamber. It is important to maintain a consistent gap around the edge of the substrate 14 to control the purge gas distribution so that a uniform center to edge deposition on the substrate can be achieved.

A purge gas feed line 22, preferably disposed within the susceptor 10, feeds a purge gas into a purge gas opening 24 between the purge guide 26 and the susceptor 10. The purge guide 26 then guides the flow of purge gas, as shown by the arrows, to the edge of the substrate 14, thereby inhibiting the process gas from coming in contact with the substrate edge and depositing thereon. Preferably, the purge gas opening 24 completely surrounds the edge of the substrate, and a plurality of purge gas feed lines 22 supply purge gas into the purge gas opening 24 to achieve even distribution of the purge gas to the edge of the substrate.

However, an excess amount of purge gas passes through a notch 16 on the substrate, diluting the processing gas adjacent the notch and preventing formation of functional devices in the region adjacent the notch. FIG. 2*b* shows the effects of the purge gas, as indicated by the arrows, in the region adjacent the notch. Typically, deposition in the region adjacent the notch 16 is non-uniform because the excess purge gas coming through the notch 16 creates an area of exclusion on the substrate. Thus, the region adjacent the notch 16 is wasted because of improper processing.

Therefore, there remains a need for an apparatus for supporting a substrate in a processing chamber which delivers a purge gas to the edge of the substrate and prevents excess purge gas from causing non-uniform and inconsistent deposition at the region adjacent the substrate notch.

SUMMARY OF THE INVENTION

The invention provides an apparatus for supporting a substrate in a processing chamber and excluding unwanted deposition at the edge of a substrate without adversely affecting deposition on the substrate in the region adjacent the substrate notch. In one aspect of the invention, a purge gas channel is provided in a susceptor and includes a notch portion disposed outwardly of the channel to direct gases at the location of a notch on a substrate away from the upper surface of the substrates. The notched portion enables delivery of purge gas to achieve the desired edge exclusion without detrimentally affecting the deposition on the region adjacent the notch on the substrate.

Another aspect of the present invention provides a purge guide with a notch formed therein which guides the purge gas away from the upper surface of the substrate adjacent the notch on the substrate to achieve the desired edge exclusion without detrimentally affecting the deposition on the region adjacent the notch on the substrate.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1B:
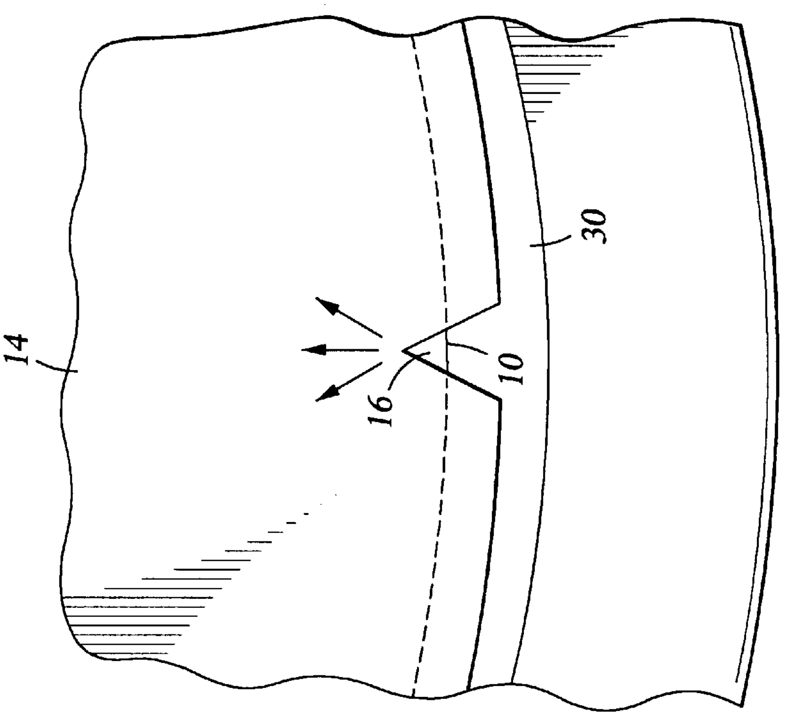
FIG. 1*b* is a partial top perspective view of a substrate supported on a susceptor having a purge gas channel surrounding the edge of the substrate.
Figure 1A:
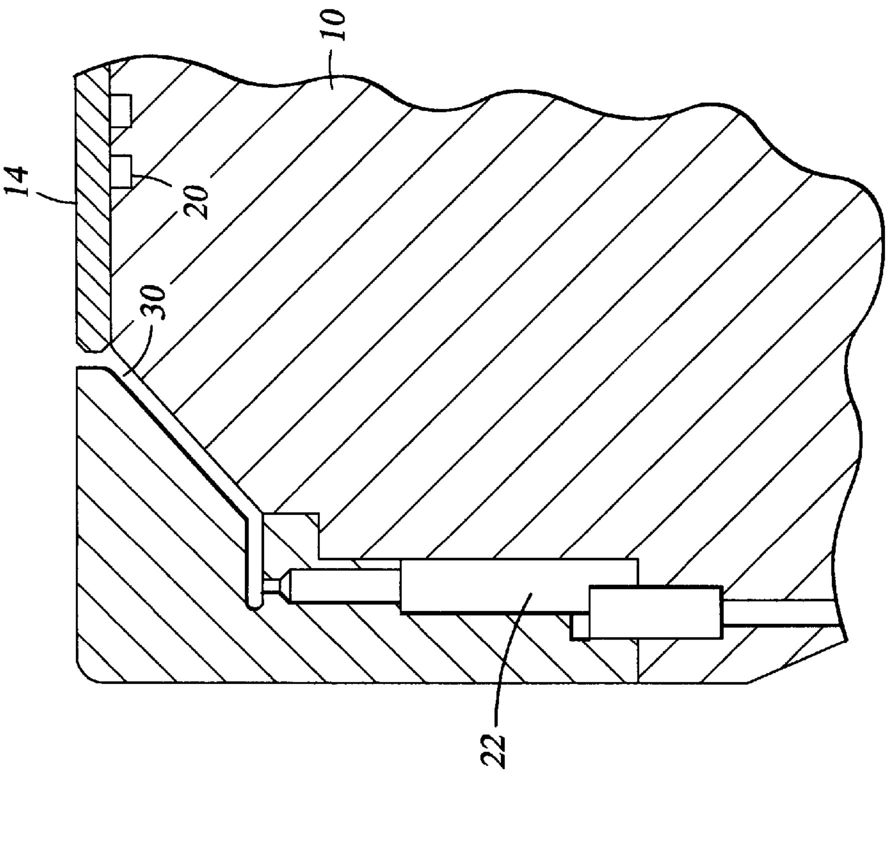
FIG. 1*a* is a partial cross sectional view of a substrate supported on a susceptor having a purge gas channel surrounding the edge of the substrate.
Figure 2B:
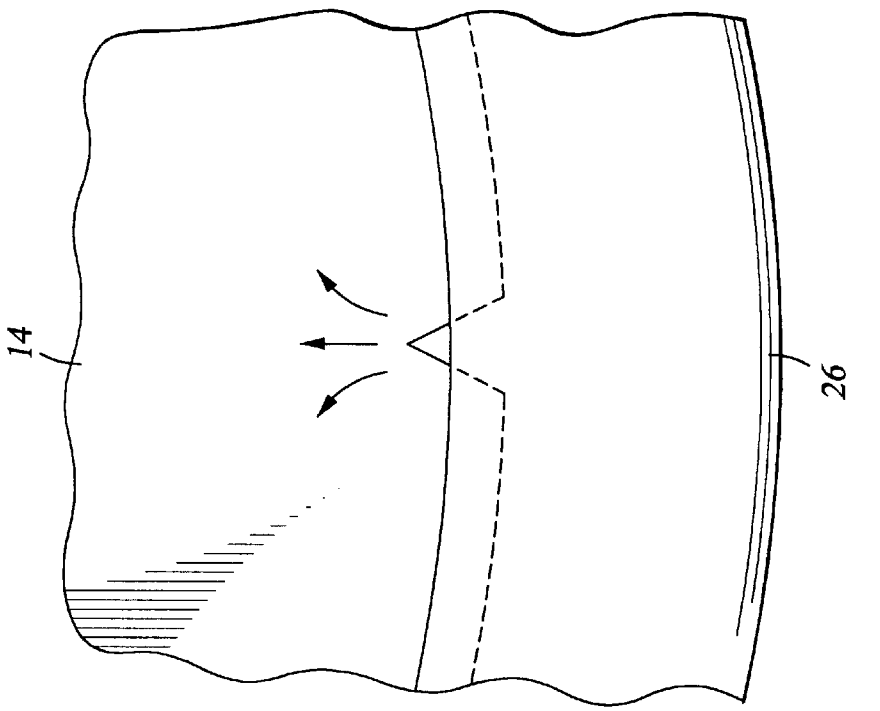
FIG. 2*b* is a partial top view of a purge guide and a substrate having a notch, showing the effects of the purge gas in the region adjacent the notch.
Figure 2A:
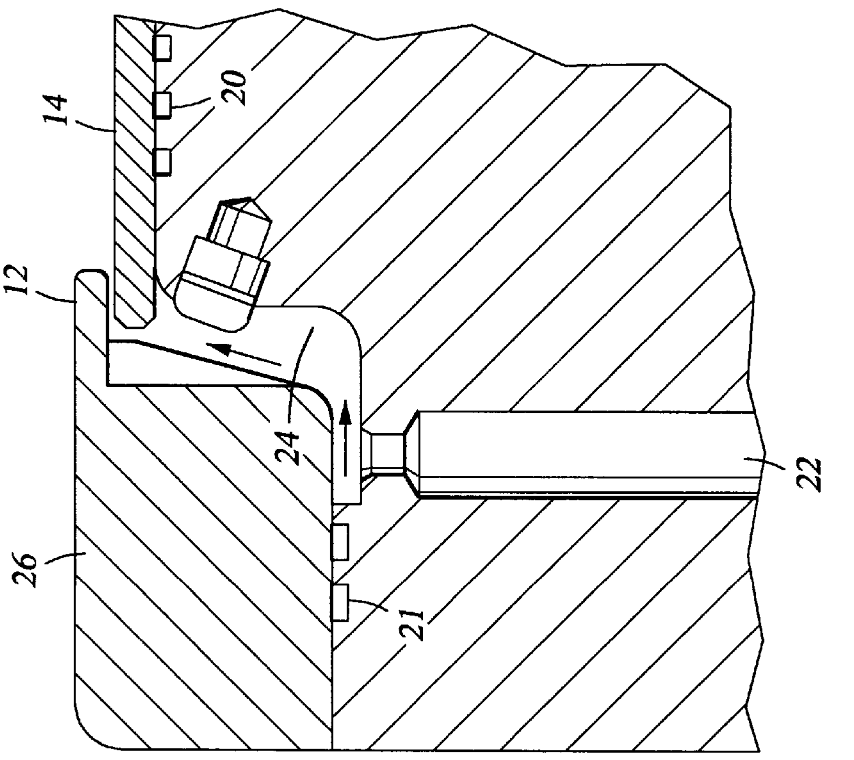
FIG. 2*a* is a partial cross sectional view of a purge guide in combination with a substrate disposed on a susceptor in a processing position.
Figure 3:
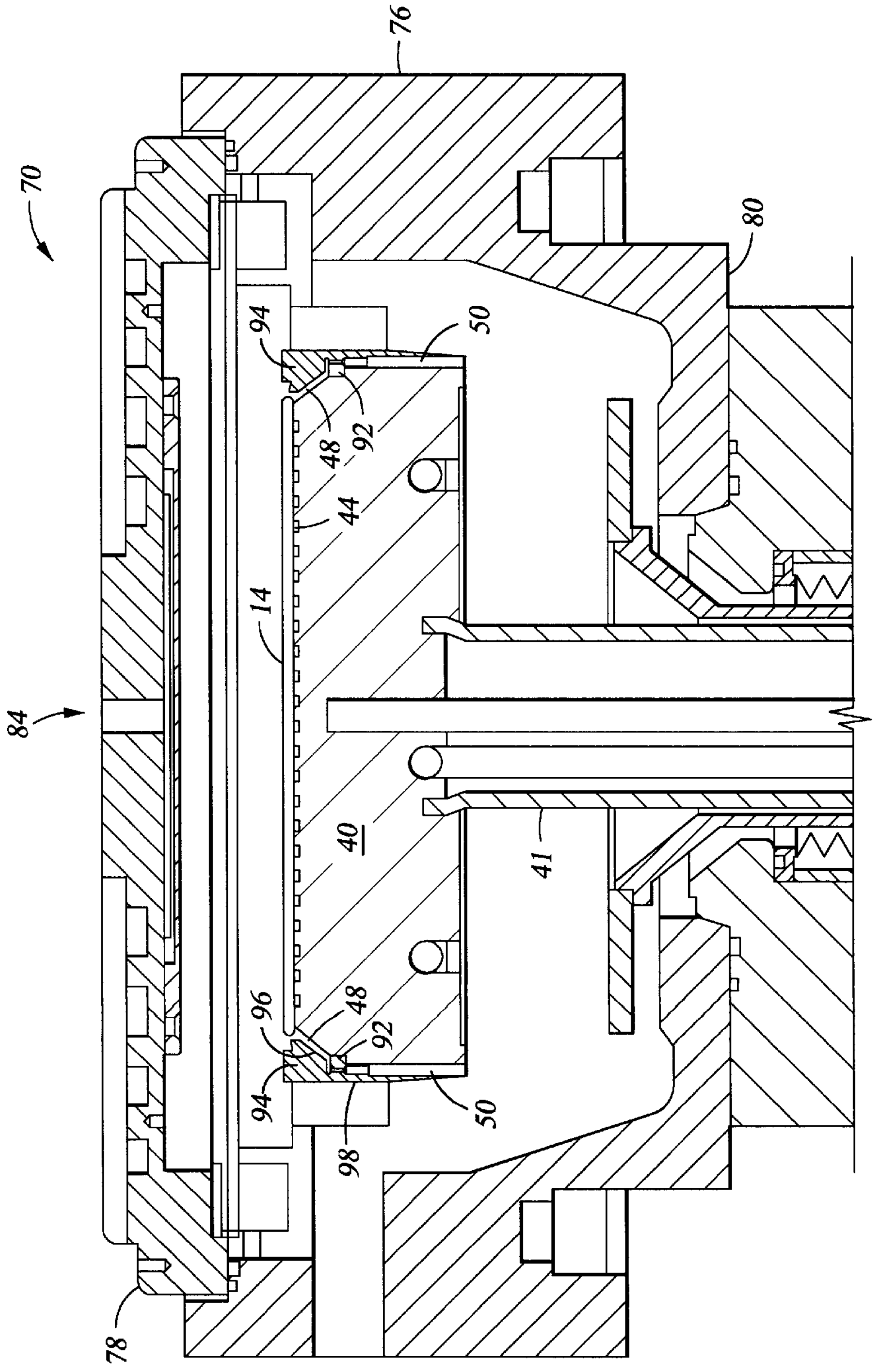
FIG. 3 is a cross sectional view of a deposition chamber showing a susceptor of the invention.

FIG. 3 is a cross sectional view of a deposition chamber 70 showing a susceptor 40 of the invention. Generally, the chamber 70 includes sidewalls 76, a lid 78 and a bottom wall 80 which define an enclosure 82. Process gas entering a gas inlet 84 in the lid is discharged into the chamber through a showerhead 86 which, as shown, is positioned in the upper portion of the chamber. The vertically movable susceptor 40, also referred to as a heater or a substrate support member, is disposed through the bottom wall of the chamber and includes an upper surface 44 to support a substrate 14.

The susceptor 40 is formed of an aluminum plate (although other materials may be used) supported in the chamber on a vertical shaft 41. The susceptor 40 includes a shoulder 92 disposed around its perimeter on which a heater shield 94 is preferably disposed. The heater shield 94 is designed to prevent deposition on the susceptor 40 and to provide a surface which is easily replaced during routine maintenance. The heater shield 94 includes an inner wall 96 and an outer vertical wall 98. The inner wall 96 of the heater shield 94 and the outer surface of the susceptor body define a purge gas channel 48. Purge gas enters the chamber through purge gas feed lines 50 formed in the susceptor 40 where it is delivered to the edge of the substrate through the purge gas channel 48.

The susceptor 40 preferably includes a vacuum chuck to secure the substrate to the support member during processing. While a vacuum chuck is preferred, other types of chucks and securing devices may be used to hold the substrate on the support member. Vacuum chucks enable the substrate to be secured to the support member without contacting the purge guide. Vacuum chucks also have been shown to improve substrate temperature uniformity, improve film uniformity, generate fewer particles in the chamber and prevent bridging between the substrate and the purge guide and the substrate and the support member.

Figure 4:
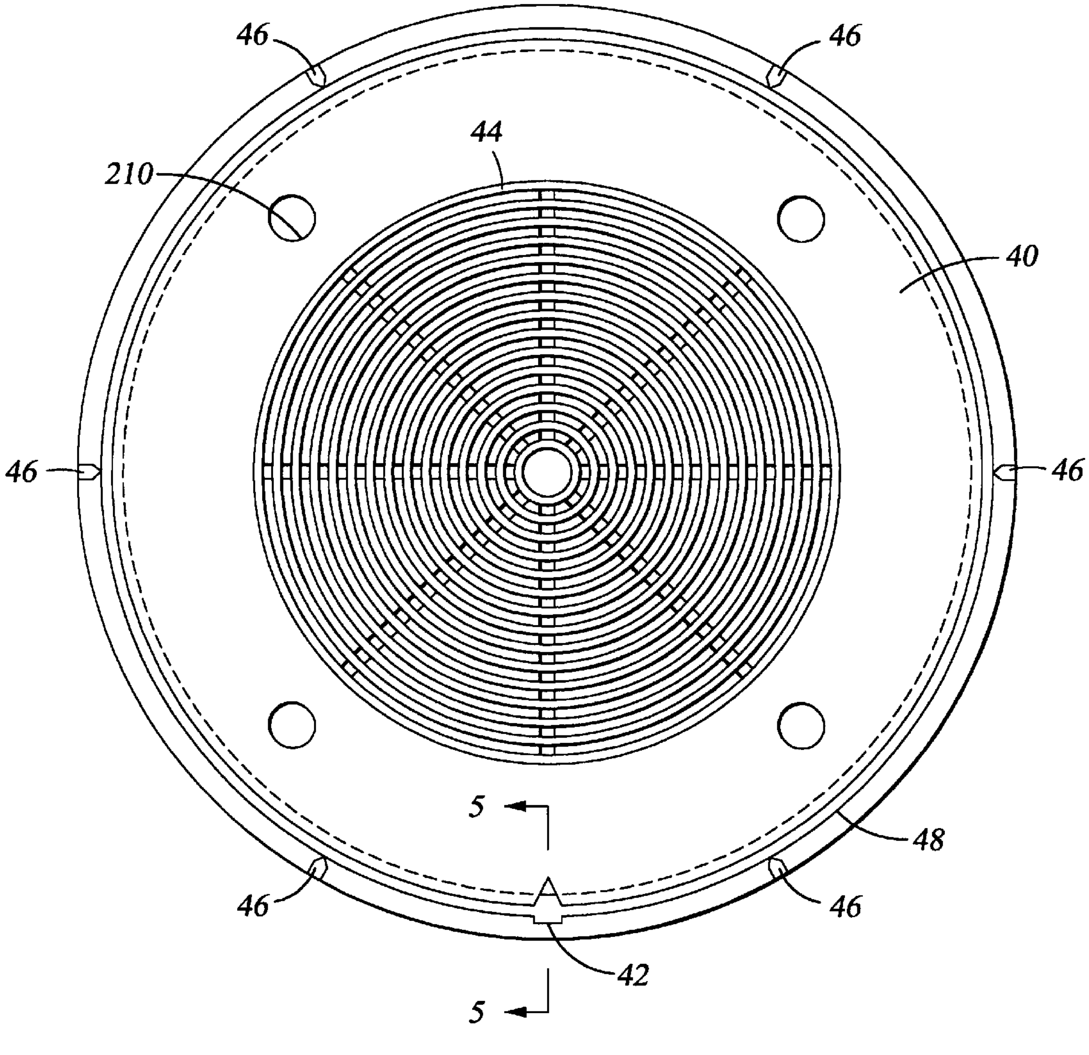
FIG. 4 is a top perspective view of a susceptor of the invention.
Figure 5:
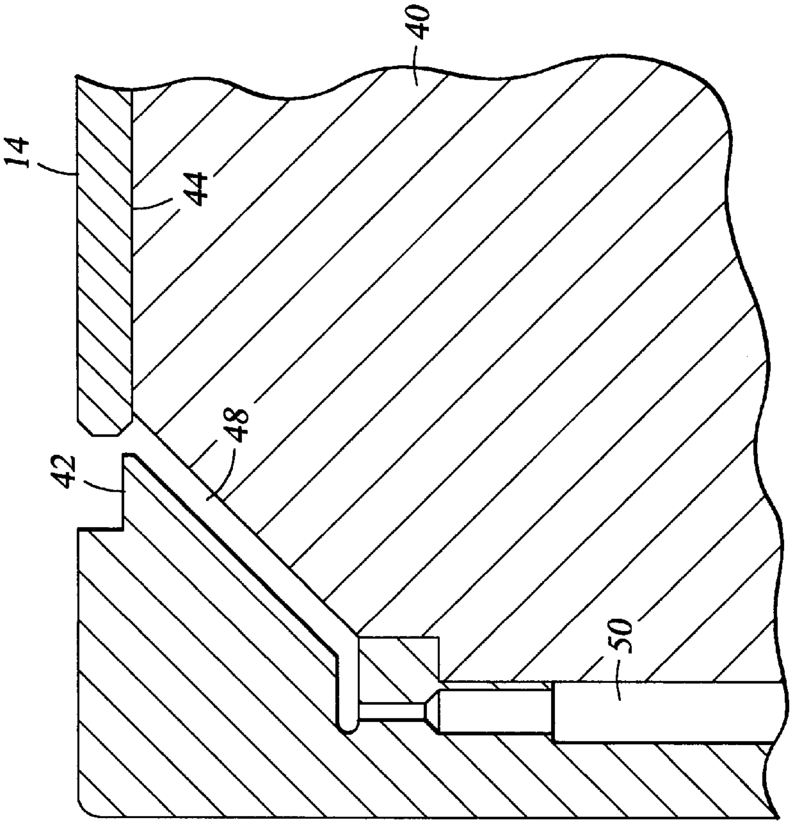
FIG. 5 is a partial cross sectional view of the susceptor of the invention taken along the line 5—5.

FIG. 4 is a top perspective view of a susceptor of the invention. FIG. 5 is a partial cross sectional view of the susceptor of the invention taken along the line 5—5. The susceptor 40 generally includes a substrate receiving surface 44, a heater (not shown) disposed in the susceptor to heat a substrate disposed on the susceptor, a plurality of substrate alignment pins 46 and a purge gas channel 48 connected to a purge gas supply 50.

The susceptor 40 of the invention includes a recess 42 which is disposed correspondingly to a notch on a substrate that is placed on the susceptor 40 during processing. Preferably, the recess 42 has a height about equal to the height of the substrate, an arc length longer than the notch opening on the substrate and a width extending outwardly from the outer edge of the purge gas channel 48 to about the depth of the notch on the substrate. To direct the purge gas away from the notch, the recess 42 preferably is greater than the notch on the substrate in all dimensions (length, width and height).

In operation, purge gas is delivered through the support member to the annular purge gas channel 48 formed in the susceptor 40. The purge gas is delivered through the purge gas channel 48 to the backside of the substrate 14 and across the edge of the substrate 14. The majority of the purge gas then flows outwardly away from the edge of the substrate and does not interfere with the deposition on the substrate.

However, at the notch of the substrate, the purge gas tends to create a gas stream which flows inwardly toward the center of the substrate because the notch in the substrate provides a low pressure region which draws the purge gas therein. This inwardly flowing purge gas dilutes the processing gas at the region adjacent the notch and prevents fabrication of functional devices in the region adjacent the notch. By providing a recess 42, the purge gas is drawn outwardly away from the center of the substrate. Thus, the purge gas flows past the edge of the substrate and into the recess 42, and the processing gas at the region adjacent the notch is then able to react and deposit a film and form functional devices properly at the region adjacent the notch.

Although the shape of the recess is shown to approximate a rectangular box, other shapes can be utilized just as effectively to divert the purge gas away from the substrate surface adjacent the notch. These shapes include but are not limited to spherical, frustoconical, ellipsoid and triangular. Furthermore, the corners and edges of the recess 42 can be tapered to further assist purge gas flow toward the recess 42 instead of toward the notch.

Alternatively, the width of the purge gas channel 48 can be increased around the entire circumference of the susceptor to decrease the inwardly flowing purge gas at the region adjacent the notch on the substrate. The increase in the opening or width of the purge gas channel 48 decreases the purge gas pressure on the back side of the substrate and allows more purge gas to flow past the edge of the substrate. Thus, the purge gas is less likely to create an inwardly-flowing gas stream at the notch which would dilute the processing gas at the region adjacent the notch. Also, the purge gas channel openings can be tapered to further induce purge gas flow outwardly away from the center of the substrate to allow uniform deposition at the region adjacent the notch.

Figure 6:
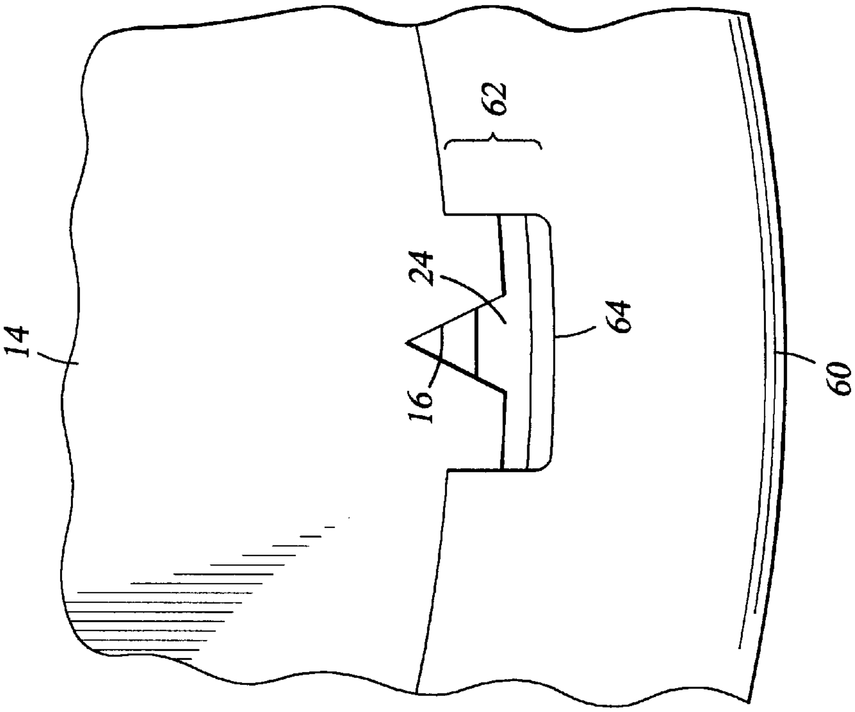
FIG. 6 is a partial top perspective view of a substrate having a notch in combination with a purge guide of the invention.

An other alternative embodiment provides a purge gas guide/delivery system which achieves the desired edge exclusion without detrimentally affecting the deposition on the region adjacent the notch on the substrate. FIG. 6 is a partial top perspective view of a substrate having a notch in combination with a purge guide of the invention. The purge guide 60 includes a shield portion 62 which extends over the edge of the substrate and a recess 64 on the shield portion 62 positioned correspondingly to the notch 16 on the substrate 14. Preferably, the recess 64 on the shield portion 62 on the purge guide 60 provides at least the same size opening over the purge gas channel 24 as that provided by the substrate notch. Because of the purge gas pressure under the shield portion 62, the purge gas tends to form a jet stream at the opening provided by the notch 16. By providing a recess 64 on the shield portion 62 of the purge guide 60 that is comparatively larger than the notch 16, the purge gas is diverted outwardly away from the center of the substrate. As with the recess described above for the susceptor, the recess 64 on the shield portion 62 of the purge guide 60 preferably has a rectangular shape, but can be a variety of shapes including spherical triangular and ellipsoid shapes.

While the foregoing is directed to the preferred embodiment of the present invention, other and further embodiments of the invention may be devised without departing from the basic scope thereof. The scope of the invention is determined by the claims which follow.

We claim:

1. An apparatus for excluding deposition on an edge of a substrate, comprising:

a purge gas guide adapted to be disposed about a substrate support surface to deliver a purge gas, wherein the purge gas guide includes a recess notch forming a gas pathway adapted to be registered with a notch on the edge of the substrate while the substrate is disposed on the substrate support surface.

2. The apparatus of claim 1 wherein the recess notch has a rectangular shape.

3. The apparatus of claim 1 wherein the recess notch has an ellipsoid shape.

4. The apparatus of claim 1 wherein the recess notch has a tapered edge.

5. The apparatus of claim 1, wherein the notch is a recess formed at an inner diameter of an upper surface of the purge gas guide, and wherein the recess is a purge gas outlet.

6. The apparatus of claim 1, wherein the purge gas guide is an annular member having guide pins disposed on an upper surface thereof and wherein the notch is a recess formed in the upper surface.

7. The apparatus of claim 1, wherein the purge gas guide is an annular member.

8. The apparatus of claim 7, further comprising guide pins disposed on an upper surface of the purge gas guide.

9. An apparatus for excluding deposition on an edge of a substrate, comprising:

a purge gas guide defining a first diameter greater than a substrate diameter and having a shield portion extending inwardly to define a second diameter less than the first diameter and less than the substrate diameter, the shield portion having a recess notch forming a purge gas pathway adapted to be registered with a notch on the edge of the substrate while the substrate is disposed on the substrate support surface.

10. The apparatus of claim 9 wherein the recess notch has a rectangular shape.

11. The apparatus of claim 9, wherein the notch is a recess formed at an inner diameter of an upper surface of the purge gas guide, and wherein the recess is a purge gas outlet.

12. The apparatus of claim, 9, wherein the purge gas guide is an annular member.

13. The apparatus of claim 12, further comprising guide pins disposed on an upper surface of the purge gas guide.

14. A susceptor for chemical vapor deposition, comprising:

a) a substrate supporting surface; and b) a purge gas guide positioned to form a channel around the substrate supporting surface to deliver a purge gas, wherein the purge gas guide includes a notch formed on an inner surface of the purge gas guide and forming a gas pathway adapted to be registered with a substrate notch while a substrate having the substrate notch formed therein is disposed on the substrate supporting surface.

15. The apparatus of claim 14 wherein the recess notch has a rectangular shape.

16. The apparatus of claim 14 wherein the recess notch has an ellipsoid shape.

17. The susceptor of claim 14, wherein the notch is a recess formed at an inner diameter of an upper surface of the purge gas guide, and wherein the recess is a purge gas outlet.

18. The susceptor of claim 14, wherein the purge gas guide is an annular member.

19. The susceptor of claim 18, further comprising guide pins disposed on an upper surface of the purge gas guide.

20. A chemical vapor deposition chamber, comprising:

a) an enclosure;

b) a processing gas inlet;

b) a susceptor disposed within the enclosure, the susceptor having a substrate supporting surface; and c) a purge gas guide positioned to form a channel disposed around the substrate supporting surface to deliver a purge gas, wherein the purge gas guide includes a notch forming a gas pathway adapted to be registered with a substrate notch while a substrate having the notch is disposed on the substrate supporting surface.

* * * * *

UNITED STATES PATENT AND TRADEMARK OFFICE

CERTIFICATE OF CORRECTION

PATENT NO. : 6,210,483 B1
DATED : April 3, 2001
INVENTOR(S) : Tsai et al.

It is certified that error appears in the above-identified patent and that said Letters Patent is hereby corrected as shown below:

Title page,
Item [56], References Cited, U.S. PATENT DOCUMENTS,
Please fix the first line.
Please replace "Shertinsky" with -- Sherstinsky --.

Signed and Sealed this

Seventeenth Day of September, 2002

*Attest:*

JAMES E. ROGAN

*Attesting Officer*

*Director of the United States Patent and Trademark Office*